(12) United States Patent
Masumoto et al.

(10) Patent No.: US 7,695,999 B2
(45) Date of Patent: Apr. 13, 2010

(54) PRODUCTION METHOD OF SEMICONDUCTOR DEVICE

(75) Inventors: Akane Masumoto, Yokohama (JP);
Shintetsu Go, Yokohama (JP);
Tomonari Nakayama, Yokohama (JP);
Toshinobu Ohnishi, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 471 days.

(21) Appl. No.: 11/513,062

(22) Filed: Aug. 31, 2006

(65) Prior Publication Data
US 2007/0085072 A1   Apr. 19, 2007

(30) Foreign Application Priority Data

Sep. 6, 2005   (JP)   ............................ 2005-258566
Mar. 10, 2006   (JP)   ............................ 2006-066319

(51) Int. Cl.
*H01L 51/40* (2006.01)
*H01L 51/00* (2006.01)

(52) U.S. Cl. ............................ 438/99; 257/40; 257/642; 257/E51.001; 257/E51.005

(58) Field of Classification Search ............... 438/99; 257/40, 642, E51.001, E51.005, E51.012, 257/E51.017, E51.018, E51.024, E51.027, 257/E39.007, E27.117, E25.008, E51.01
See application file for complete search history.

(56) References Cited

U.S. PATENT DOCUMENTS

| 5,659,181 | A | 8/1997 | Bridenbaugh et al. | ......... 257/40 |
|---|---|---|---|---|
| 7,094,625 | B2 | 8/2006 | Miura et al. | ................... 438/99 |
| 7,140,321 | B2 | 11/2006 | Nakayama et al. | .......... 118/723 |
| 2003/0102472 | A1* | 6/2003 | Kelley et al. | ................... 257/40 |
| 2005/0202348 | A1 | 9/2005 | Nakayama et al. | .......... 430/311 |
| 2006/0081880 | A1* | 4/2006 | Miyazaki et al. | ............. 257/200 |
| 2006/0113523 | A1 | 6/2006 | Kubota et al. | .................. 257/40 |
| 2006/0145141 | A1 | 7/2006 | Miura et al. | ................... 257/40 |
| 2006/0214159 | A1 | 9/2006 | Nakayama et al. | ............ 257/40 |
| 2007/0012914 | A1 | 1/2007 | Miura et al. | ................... 257/40 |
| 2007/0051947 | A1 | 3/2007 | Nakayama et al. | ............ 257/40 |
| 2007/0096079 | A1 | 5/2007 | Nakayama et al. | ............ 257/40 |

FOREIGN PATENT DOCUMENTS

JP   5-55568   3/1993

(Continued)

OTHER PUBLICATIONS

A. R. Brown, et al., "Precursor route pentacene metal-insulator-semiconductor field-effect transistors", Journal of Applied Physics, vol. 79, No. 4, Feb. 15, 1996, pp. 2136-2138.

(Continued)

*Primary Examiner*—Alexander G Ghyka
*Assistant Examiner*—Leonard Chang
(74) *Attorney, Agent, or Firm*—Fitzpatrick, Cella, Harper & Scinto

(57) ABSTRACT

Provided is a method of producing a semiconductor device having an organic semiconductor layer, which includes the steps of providing a crystallization promoting layer on a substrate; providing an organic semiconductor precursor on the crystallization promoting layer; and applying light energy and thermal energy simultaneously to the organic semiconductor precursor to form a layer containing an organic semiconductor. Thereby, an organic semiconductor device is provided which is low cost and has excellent durability.

5 Claims, 1 Drawing Sheet

FOREIGN PATENT DOCUMENTS

| | | | |
|---|---|---|---|
| JP | 5-190877 | | 7/1993 |
| JP | 8-264805 | | 10/1996 |
| JP | 2003304014 | * | 10/2003 |
| JP | 2004-221318 | | 8/2004 |
| WO | 2004/079834 | | 9/2004 |
| WO | WO2005/086254 | * | 9/2005 |

OTHER PUBLICATIONS

Christos D. Dimitrakopoulos, et al.; "Organic Thin Film Transistors for Large Area Electronics", Advanced Materials, vol. 14, No. 2, Jan. 16, 2002, pp. 99-117.

Hiroyuki Furuta, et al., "Observation of Ramsey-Type Resonant Fringe Using a Cylindrical Microwave Cavity for a Diode Laser-Pumped Rb Beam Atomic Clock", Japanese Journal of Applied Physics, vol. 30, No. 3, Mar. 1991, pp. 596-602.

H. Sirringhaus, et al., "Two-dimensional charge transport in self-organized, high-mobility conjugated polymers", Nature, vol. 401, Oct. 14, 1999, pp. 685-688.

Kaname Ito, et al, "Oligo(2,6-anthrylene)s: Acene-Oligomer Approach for Organic Field-Effect Transistors", Angew. Chem. Int. Ed., vol. 42, No. 10, 2003, pp. 1159-1162.

* cited by examiner

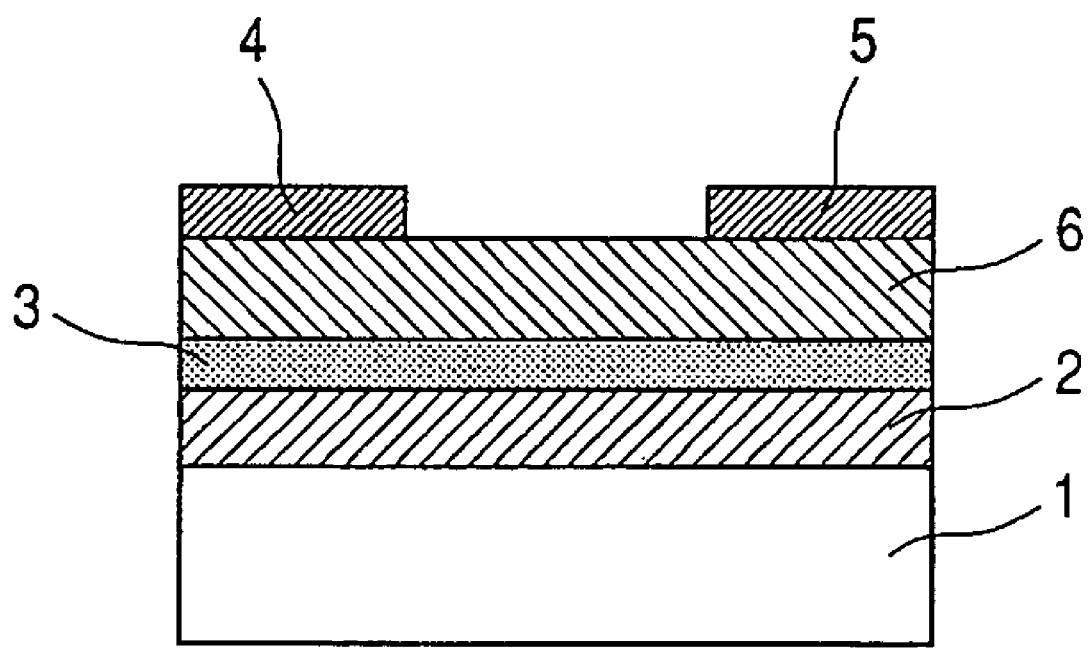
FIGURE

PRODUCTION METHOD OF SEMICONDUCTOR DEVICE

BACKGROUND OF THE INVENTION

1. Field of the Invention

The present invention relates to a method of producing a semiconductor device by use of a precursor of an organic semiconductor compound.

2. Description of the Related Art

The development of thin-film transistors employing an organic semiconductor gradually began to become more active in the latter half of the 1980s. In recent years the basic performance of thin-film transistors employing an organic semiconductor now exceeds the basic performance of thin-film transistors employing amorphous silicon. There are often cases where organic semiconductor materials have a high affinity with a plastic substrate on which a semiconductor device, such as a thin-film field effect transistor (FET), is formed. Therefore, organic semiconductor materials are desirable as the material for a semiconductor layer in devices which are required to have flexibility or light weight. Further, it is possible for a part of the organic semiconductor material to form a film by application of a solution or by use of a printing method. If such a material is used, a device with a large area can be fabricated at low cost.

Examples of organic semiconductor materials which have hitherto been proposed include the following. First, there are included acenes disclosed in Japanese Patent Application Laid-Open No. H05-55568 such as pentacene and tetracene; low-molecular compounds disclosed in Japanese Patent Application Laid-Open No. H05-190877 such as phthalocyanines including lead phthalocyanine, perylene and tetracarboxylic acid derivatives thereof; and high-molecular compounds disclosed in Japanese Patent Application Laid-Open No. H08-264805, such as aromatic oligomers typified by thiophene hexamers referred to as α-thienyl or sexythiophene, as well as polythiophene, polythienylenevinylene and poly-p-phenylenevinylene. Incidentally, many of these compounds are also disclosed in Advanced Material, Vol. 2, pp. 99-117, 2002.

The characteristics such as non-linear optical characteristics, electrical conductivity and semiconductor characteristics, which are required when producing a device with the above compounds being used for a semiconductor layer, do not depend only on the purity of a material but also largely depend on the crystallinity and orientation of the material.

Meanwhile, many of low-molecular compounds having a π-conjugated system extended (e.g., pentacene) have high crystallinity and are insoluble in solvents. Therefore, thin-films of most of these compounds are generally formed by using a vacuum deposition process. While it is known that pentacene exhibits a high electric field effect mobility, there has been a problem that pentacene is unstable in the atmosphere, easily oxidized and susceptible to degradation. Moreover, in the case of using a vacuum film forming technique such as vacuum-deposition process, the merits of the organic semiconductor material in enabling production at low cost are lost.

On the other hand, there are often cases where organic semiconductors using a π-conjugated polymer are able to easily form a thin film using a solution coating process or a similar technique. Therefore, applied development of organic semiconductor films using a π-conjugated polymer has been progressing due to the fact that such films often have excellent formability ("Japanese Journal of Applied Physics", Japan Society of Applied Physics, Vol. 30, pp. 596-598, 1991). In the case of π-conjugated polymers, it is known that the state of arrangement of molecular chains thereof has a large influence on the electrical conductivity. Similarly, it has been reported that the electric field effect mobility of π-conjugated polymer field effect transistors largely depends on the state of arrangement of molecular chains in a semiconductor layer ("Nature", Nature Publishing Group, Vol. 401, pp. 685-687, 1999). However, since the arrangement of molecular chains of π-conjugated polymers is effected in a period from coating of a solution to its drying, there is a possibility that the state of arrangement of molecular chains may vary greatly depending on changes in environment or a kind of coating methods. Thus, there is a concern that the electric field effect mobility varies depending on coating conditions, which makes stable production difficult.

In recent years there has also been reported a FET which employs a film in which a thin film made of a soluble precursor of pentacene is formed by coating, which is then converted to pentacene by heat-treatment or light irradiation ("J. Appl. Phys.", Vol. 79, p. 2136, 1996; WO A1 2004079834; Japanese Patent Application Laid-Open No. 2004-221318). In the case of converting the precursor to pentacene by heat-treatment, there have been the problems that a high-temperature treatment is required for the conversion to pentacene, and that eliminated components with a large mass need to be removed by pressure reduction. On the other hand, in the case of converting the precursor to pentacene by light irradiation, while a high-temperature treatment is not required, there still remains the problem that obtained pentacene is unstable in the atmosphere, easily oxidized and susceptible to degradation.

As described above, hitherto, when producing a semiconductor device using an organic semiconductor compound such as a field effect transistor, a semiconductor layer has been formed having good crystallinity and orientation by undergoing a vapor deposition step or the like. However, there have been the problems that vapor deposition is expensive, and acenes, which are typical organic semiconductors, are susceptible to be oxidized to be thereby degraded. Further, while coating methods are low cost, because the arrangement state of molecular chains can be disrupted unless the coating conditions are strictly controlled, the variability in characteristics between individual devices has been a concern.

SUMMARY OF THE INVENTION

The present invention has been accomplished in order to resolve the above-mentioned problems, and it is an object of the present invention to provide a semiconductor device having less variability in characteristics and high durability by means of a simple method.

The present invention provides a method of producing a semiconductor device comprising an organic semiconductor layer, which comprises the steps of providing a crystallization promoting layer on a substrate; providing an organic semiconductor precursor on the crystallization promoting layer; and applying light energy and thermal energy simultaneously to the organic semiconductor precursor to form a layer comprising an organic semiconductor.

Further, the present invention is the method of producing a semiconductor, wherein the thermal energy is applied by externally heating the substrate. The term "externally heating" herein employed means that thermal energy is applied separately from energy resulting from heat generation of the organic semiconductor precursor and substrate by receiving the light energy.

Moreover, the present invention is the method of producing a semiconductor device, wherein the crystallization promoting layer has a function of promoting bonding between crystal grains.

Further, the present invention is the method of producing a semiconductor device, wherein the step of applying light energy and thermal energy simultaneously to the organic semiconductor precursor to form the layer comprising the organic semiconductor comprises the step of allowing the organic semiconductor precursor to cause an elimination reaction.

Moreover, the present invention is the method of producing a semiconductor device, wherein a retro Diels-Alder reaction is employed as the elimination reaction.

Further, the present invention is the method of producing a semiconductor device, wherein the step of providing the organic semiconductor precursor on the crystallization promoting layer is a step in which a solution containing the organic semiconductor precursor is coated or printed on the crystallization promoting layer.

Moreover, the present invention is the method of producing a semiconductor device, wherein a layer comprising a polysiloxane compound is provided as the crystallization promoting layer.

Further, the present invention is the method of producing a semiconductor device, wherein as the polysiloxane compound, there is used a compound having at least a structure represented by the following general formula (1):

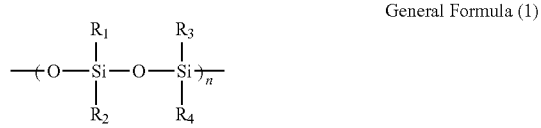

General Formula (1)

wherein $R_1$, $R_2$, $R_3$, and $R_4$ are independently selected from the group consisting of a substituted or unsubstituted alkyl group having 1 to 8 carbon atoms, an alkenyl group, a substituted or unsubstituted phenyl group, and a siloxane unit; and "n" is an integer of 1 or more.

Incidentally, the expression "substituted or unsubstituted" herein employed means that a hydrogen atom, methyl group or methylene group in the subject group or unit may be substituted with another atom or group. Here, examples of "another atom or group" include a halogen atom, hydroxyl group, cyano group, phenyl group, nitro group, mercapto group and glycidyl group. Further, when methyl group or methylene group is substituted, the term "number of carbon atoms" refers to the number of carbon atoms after the substitution (i.e. the actual number of carbon atoms).

Moreover, the present invention is the method of producing a semiconductor device, wherein as the polysiloxane compound, there is used a polysiloxane compound having at least a structure represented by the following general formula (2) or (3):

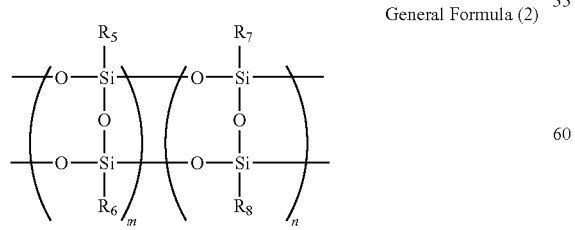

General Formula (2)

wherein $R_5$, $R_6$, $R_7$, and $R_8$ are selected independently from the group consisting of a substituted or unsubstituted alkyl group having 1 to 8 carbon atoms, an alkenyl group, and a substituted or unsubstituted phenyl group; "m" and "n" are each an integer of 0 or more; and the sum of "m" and "n" is an integer of 1 or more; and

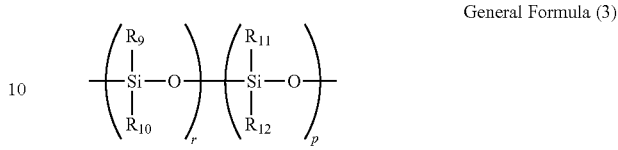

General Formula (3)

wherein $R_9$, $R_{10}$, $R_{11}$, and $R_{12}$ are selected independently from the group consisting of a substituted or unsubstituted alkyl group having 1 to 8 carbon atoms, an alkenyl group, and a substituted or unsubstituted phenyl group; "r" and "p" are each an integer of 0 or more; and the sum of "r" and "p" is an integer of 1 or more.

Incidentally, the word "or" used in the above definitions is a concept which includes the meaning of the word "and". Therefore, it is to be noted that the present invention encompasses the embodiment where the polysiloxane compound has the both structures represented by the above general formulae (2) and (3).

Further, the present invention is the method of producing a semiconductor device, wherein as the organic semiconductor precursor, there is used a compound having, as a partial structure in a molecule thereof, at least one selected from the group consisting of the bicyclo structures represented by the following general formulae (4) and (5):

General Formula (4)

wherein $R_{13}$ and $R_{14}$ each independently represent one selected from the group consisting of an oxygen atom, a sulfur atom and $NR_{15}$; and $R_{15}$ represents one selected from the group consisting of $C_1$-$C_{12}$ linear or branched alkyl group, alkenyl group, alkoxy group, alkylthio group, alkyl ester group, aryl group, and hydroxyl group; and

General Formula (5)

wherein $R_{16}$ represents an oxygen atom or sulfur atom.

Moreover, the present invention is the method of producing a semiconductor device, wherein as the organic semiconductor precursor, there is used a compound represented by the following general formula (6):

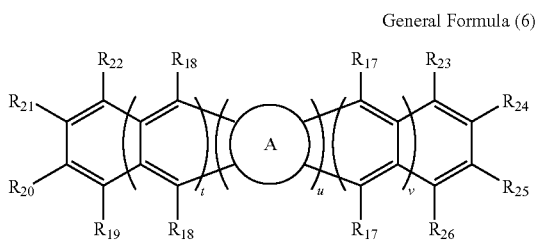

General Formula (6)

wherein ring "A" represents one selected from the group consisting of the bicyclo rings represented by general formulae (4) and (5); $R_{17}$ and $R_{18}$ each independently represent a hydrogen atom, an alkyl group, an alkoxyl group, an ester group or a phenyl group; $R_{19}$, $R_{20}$, $R_{21}$, $R_{22}$, $R_{23}$, $R_{24}$, $R_{25}$, and $R_{26}$ each independently represent a hydrogen atom, an alkyl group, an alkoxyl group, an aryl group, a heterocyclic group, an aralkyl group, a phenoxy group, a cyano group, a nitro group, an ester group, a carboxyl group or a halogen atom; $R_{20}$ and $R_{21}$, and $R_{24}$ and $R_{25}$ may be bonded together to form ring A or a 5- or 6-membered heterocyclic ring, respectively; and the sum of "t", "u", and "v" is an integer of 1 or more.

Further, the present invention is a method of producing a semiconductor device, wherein as the compound represented by the above general formula (6), a compound is used in which ring A is represented by the above general formula (4), and $R_{13}$ and $R_{14}$ are oxygen atoms.

Moreover, the present invention is a method of producing a field effect transistor comprising an organic semiconductor layer, which comprises the steps of: providing a layer comprising a polysiloxane compound on a substrate; providing an organic semiconductor precursor on the layer comprising the polysiloxane compound; and applying light energy and thermal energy simultaneously to the organic semiconductor precursor to form a layer comprising an organic semiconductor. This production method can be combined with the invention as described above by replacing the term "crystallization promoting layer" in the above specific feature with the term "layer comprising a polysiloxane compound".

Further, the present invention is a method of producing a semiconductor device, wherein the semiconductor device is a field effect transistor.

The scope of the present invention also encompasses various combinations of the above-described features.

Further features of the present invention will become apparent from the following description of exemplary embodiments with reference to the attached drawings.

BRIEF DESCRIPTION OF THE DRAWINGS

The FIGURE is a schematic cross-sectional view illustrating a part of one embodiment of the field effect transistor according to the present invention.

DESCRIPTION OF THE EMBODIMENTS

The present invention will now be described in more detail.

The present inventors have discovered that a method in which after an organic semiconductor precursor is provided on a layer comprising a polysiloxane compound, light energy and thermal energy are applied simultaneously to the organic semiconductor precursor is effective in forming a high-quality organic semiconductor layer. Hereinafter, "layer comprising a polysiloxane compound" is sometimes simply referred to as "polysiloxane compound layer". In a method of forming an organic semiconductor layer, after an organic semiconductor precursor and a layer which promotes crystallization (crystallization promoting layer) or a layer comprising a polysiloxane compound are stacked to form a thin film, light energy and thermal energy are simultaneously applied. It is believed that according to such a method, organic semiconductor crystals can be formed over the entirety of a substrate which are continuously uniform and has fewer defects at the boundary thereof and are less susceptible to degradation by external stimuli such as oxygen and water. Thus, it is believed that organic semiconductor devices can be fabricated which have less variability in characteristics between individual devices and have high durability. Such method is considered to be especially effective in fabricating an organic field effect transistor which is one example of the organic semiconductor device.

Within the scope of investigation carried out by the present inventors, it is thought that the polysiloxane compound has the effect of promoting crystallization of the organic semiconductor. Therefore, it can be considered that the present invention would be suitable not only for polysiloxane compounds, but also when using a layer (crystallization promoting layer) which promotes crystallization of a wide variety of organic semiconductors. Here, according to the observations and thoughts of the present inventors, the crystallization promoting layer has the following crystallization promoting function. That is, the term "crystallization promoting function" refers to a function which promotes stabilization of crystal grains (including cases where movement or rotation is involved) and/or bonding between crystal grains. Therefore, the term "crystallization promoting layer" refers to a layer which promotes stabilization of crystal grains (including cases where movement or rotation is involved) and/or bonding between crystal grains.

Further, the term "substrate" herein employed refers to an underlying structure on which such a crystallization promoting layer is formed. In the case of a field effect transistor, it is usually a structure consisting of a base material, a gate electrode, and a gate insulating layer. However, in some cases the gate insulating layer may be omitted, and depending on the stacking order, it may be only a base member. Further, in some cases, other layers may be additionally formed.

It is preferable that the crystallization promoting layer according to the present invention comprises a polysiloxane compound.

Regardless of whether constituting a crystallization promoting layer or not, the term "polysiloxane compound" herein employed refers to a polymer which has a siloxane structure (—Si—O—) and an organic silane structure. In other words, as long as these structures are possessed, the polysiloxane compound may be a copolymer with other organic polymers or inorganic polymers. When the polysiloxane compound is a copolymer with other polymers, the siloxane structure and organic silane structure may be present in a main chain thereof, or may be present in a side chain through graft polymerization or the like. Further, the term "organic silane structure" herein employed refers to a structure wherein Si and C are directly bonded.

As the polysiloxane compound used in the present invention, there are included various structures such as a linear (straight chain) structure, a cyclic structure or the like. It is preferred that the polysiloxane compound according to the present invention has a high order of crosslinking or branched structure. The expression "a high order of crosslinking or branched structure" employed herein includes a network structure, a ladder structure, a cage structure, a star structure or a dendroid structure. Further, it is not necessarily required that the crosslinked or branched structure must be formed via a siloxane structure. Structures in which organic groups such as vinyl group, acryloyl group, epoxy group, cinnamoyl group or the like are crosslinked, or structures which are branched via a tri- or higher functional organic group may also be included.

The polysiloxane compound used in the present invention comprises, for example, a structure represented by the following general formula (1). In this structure, the main chain is a siloxane unit, and the side chains ($R_1$ to $R_4$) are substituents having an organic group, such as a hydrogen atom or a carbon atom.

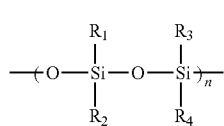

General Formula (1)

In the above formula, $R_1$, $R_2$, $R_3$, and $R_4$ are independently selected from the group consisting of a substituted or unsubstituted alkyl group having 1 to 8 carbon atoms, an alkenyl group, a substituted or unsubstituted phenyl group, and a siloxane unit.

Examples of the substituted alkyl group include an alkyl group wherein a hydrogen atom is substituted with a halogen atom, a hydroxyl group, a cyano group, a phenyl group, a nitro group, a mercapto group or a glycidyl group. Further, the methyl group or methylene group may be substituted with an amino group. Moreover, examples of the substituted phenyl group include a phenyl group in which a hydrogen atom is substituted with a halogen atom, a hydroxyl group, a cyano group, a nitro group, a mercapto group or a glycidyl group. Of course, the substituents are not limited to these examples. Incidentally, excluding exceptional cases which are theoretically impossible, the above examples also apply to all of the R and $R_n$ ("n" being a natural number) of the siloxane compounds described below.

The substituents $R_1$ to $R_4$ may also be a siloxane unit as shown below.

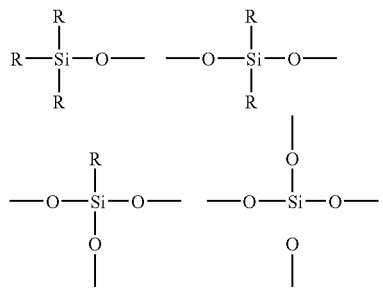

In the above formulae, R is selected independently from the group consisting of a substituted or unsubstituted alkyl group having 1 to 8 carbon atoms, a substituted or unsubstituted phenyl group, and the siloxane unit shown above.

While examples of the shape of the structure of the polysiloxane include linear, cyclic, network, ladder, cage structures and the like depending on the kind of the substituent in the general formula (1), the polysiloxane used in the present invention may have any one of these shapes.

Another example of the polysiloxane compound used in the present invention includes a compound having the structure represented by the following general formula (3):

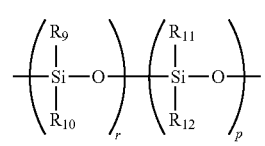

General Formula (3)

wherein $R_9$, $R_{10}$, $R_{11}$, and $R_{12}$ are selected independently from the group consisting of a substituted or unsubstituted alkyl group having 1 to 8 carbon atoms, an alkenyl group, and a substituted or unsubstituted phenyl group; "r" and "p" are each an integer of 0 or more; and the sum of "r" and "p" is an integer of 1 or more.

It is especially preferable that the polysiloxane compound used in the present invention have at least a specific silsesquioxane skeleton such as represented by the following general formula (2):

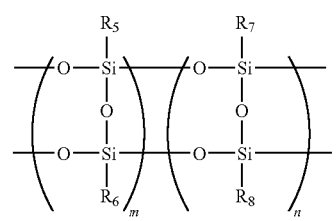

General Formula (2)

wherein $R_5$, $R_6$, $R_7$, and $R_8$ are selected independently from the group consisting of a substituted or unsubstituted alkyl group having 1 to 8 carbon atoms, an alkenyl group, and a substituted or unsubstituted phenyl group; "m" and "n" are each an integer of 0 or more; and the sum of "m" and "n" is an integer of 1 or more. In the case of being a copolymer, the copolymer may be either a random copolymer or a block copolymer. More specific examples of $R_5$ to $R_8$ include an unsubstituted alkyl group such as a methyl group or an ethyl group; an unsubstituted phenyl group; and a substituted phenyl group such as a dimethylphenyl group or a naphthyl group. Further, the substituents $R_5$ to $R_8$ may contain various atoms such as an oxygen atom, a nitrogen atom or a metal atom, in addition to the carbon and hydrogen atoms.

A siloxane compound having both a structure represented by general formula (2) and a structure represented by general formula (3) may also be used in the present invention.

The silsesquioxane skeleton in the present invention will now be described. In general formula (2), a structure is shown in which an "m" times repetition of silsesquioxane unit (hereinafter, referred to as "first unit") having substituents $R_5$ and $R_6$ is connected to an "n" times repetition of silsesquioxane unit (hereinafter, referred to as "second unit") having substituents $R_7$ and $R_8$. Incidentally, "m" and "n" are each an integer of 0 or more, and that the sum of "m" and "n" is an integer of 1 or more. However, it is not necessarily required that the repetition of the first unit and the repetition of the second unit are isolated from each other. The both units may be connected in the isolated manner, or may be connected in a randomly mingled (or mixed) manner.

Examples of the method for forming on a substrate a crystallization promoting layer according to the present invention, with a compound having a specific silsesquioxane skeleton such as represented by general formula (2) being used as a main component, include the following. Namely, a solution containing one or both of polyorganosilsesquioxane compounds as represented by the following general formulae (7) and (8) is coated on a substrate, which is then heated and dried.

The heat treatment temperature at that time is preferably 140° C. or more, more preferably 150 to 230° C. When heating is carried out at a temperature of less than 140° C., there is a fear that the hydrolysis reaction may be insufficient.

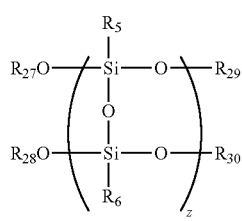

General Formula (7)

In the above formula, $R_5$ and $R_6$ are selected independently from the group consisting of a substituted or unsubstituted alkyl group having 1 to 8 carbon atoms and a substituted or unsubstituted phenyl group; $R_{27}$, $R_{28}$, $R_{29}$, and $R_{30}$ are each independently an alkyl group having 1 to 4 carbon atoms or a hydrogen atom; and "z" is an integer of 1 or more.

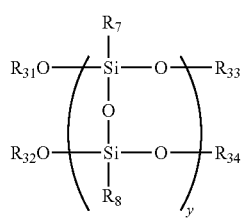

General Formula (8)

In the above formula, $R_7$ and $R_8$ are selected independently from the group consisting of a substituted or unsubstituted alkyl group having 1 to 8 carbon atoms and a substituted or unsubstituted phenyl group; $R_{31}$, $R_{32}$, $R_{33}$, and $R_{34}$ are each independently an alkyl group having 1 to 4 carbon atoms or a hydrogen atom; and "y" is an integer of 1 or more.

As a result of the heating and drying, a hydrolysis reaction is induced at the ends of the compounds, whereby the raw material silsesquioxane compounds are connected in a ladder shape, thus becoming denser. However, since at this stage the heating and drying temperature is not so high that the organic compound is completely lost, the raw material compounds do not come to have a complete silica structure but have a silsesquioxane skeleton in which most of the substituents still remain. The feature that the structure is not turned into a complete silica structure can be said to be one of the points in obtaining a good semiconductor layer.

Further, during the drying step, a small amount of an acid such as formic acid may be added to the coating solution in order to promote the reaction in which the oligomer silsesquioxane compounds crosslink with each other.

The addition amount of the acid is not especially limited. When formic acid is used as the acid, its addition of an amount within the range of 1 to 30% by weight with respect to the solid content weight of the polyorganosilsesquioxane compound in the coating solution promotes the crosslinking reaction, which is preferable. When the addition amount is less than 1% by weight, there is a fear that the effect of promoting the crosslinking reaction is insufficient. On the other hand, when the addition amount is more than 30% by weight, there is a fear that the properties of the film after drying may become poor.

During the crosslinking reaction and solvent removal, stabilizers which are not evaporated, volatized or eliminated at the temperature are removed as much as possible from the solution system.

As the solvent for the coating solution, any solvent such as alcohol, ester and the like may be used. The solvent may be selected suitably taking into account the wettability to the substrate and the like.

The method of coating the raw material solution of the polysiloxane compound layer or crystallization promoting layer is not especially limited. Examples of the coating method include conventional coating methods, such as spin coating, casting, spray coating, a doctor blade method, die-coating, dipping, printing, an ink jet method and a dropping method. Examples of printing methods include screen printing, offset printing, gravure printing, flexographic printing, micro contact printing and the like. Among these methods, spin coating, dipping, spray coating and an ink jet method are preferable, as these coating methods are able to control the coating amount, which enables a desired film thickness to be formed. Further, it is important to prevent the intrusion of dirt or the like into the coating solution as much as possible in order to maintain the insulating properties of the obtained film, and thus it is desirable to filter the raw material solution beforehand through a membrane filter.

It is preferable to adjust the solution concentration such that the film thickness of each of the polysiloxane compound layer and the crystallization promoting layer is 10 nm or more, and preferably 15 to 500 nm. This is because if the film thickness is less than 10 nm, it may become difficult to obtain a uniform film.

Before the coating formation of the polysiloxane compound layer and crystallization promoting layer, the surface of the substrate may be modified by ultrasonic treatment, UV irradiation and the like using an alkaline solution in order to improve the wettability of the substrate surface.

Next, the organic semiconductor precursor used in the present invention will be explained. It is preferable that the organic semiconductor precursor has, as a partial structure in a molecule thereof, at least one selected from the group consisting of the bicyclo structures represented by the following general formulae (4) and (5):

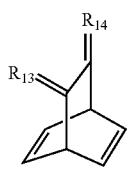

General Formula (4)

wherein $R_{13}$ and $R_{14}$ each independently represent one selected from the group consisting of an oxygen atom, a sulfur atom and $NR_{15}$; and $R_{15}$ represents one selected from the group consisting of $C_1$-$C_{12}$ linear or branched alkyl group, alkenyl group, alkoxy group, alkylthio group, alkyl ester group, aryl group, and hydroxyl group; and

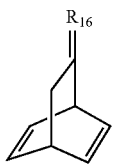

General Formula (5)

wherein $R_{16}$ represents an oxygen atom or sulfur atom.

Further, it is preferable that the organic semiconductor precursor having the bicyclo structure represented by the general formulae (4) and (5) is converted by light into an acene compound, with the structure represented by the following general formula (6) being more preferable.

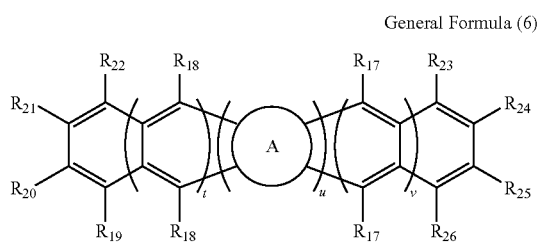

General Formula (6)

In the above formula, ring A represents one selected from the group consisting of the bicyclo rings represented by general formulae (4) and (5). $R_{17}$ and $R_{18}$ each independently represent a hydrogen atom, an alkyl group, an alkoxyl group, an ester group or a phenyl group. $R_{19}$, $R_{20}$, $R_{21}$, $R_{22}$, $R_{23}$, $R_{24}$, $R_{25}$, and $R_{26}$ each independently represent a hydrogen atom, an alkyl group, an alkoxyl group, an aryl group, a heterocyclic group, an aralkyl group, a phenoxy group, a cyano group, a nitro group, an ester group, a carboxyl group or a halogen atom. The term "aryl group" herein employed refers to a monovalent, monocyclic and polycyclic aromatic hydrocarbon group. Examples of the polycyclic aromatic hydrocarbon include compounds in which 2 to 15 aromatic hydrocarbon rings are fused together, such as naphthalene, anthracene, azulene, heptalene, biphenylene, indacene, acenaphthylene, phenanthrene, triphenylene, pyrene, chrysene, picene, perylene, pentaphene, rubicene, coronene, pyranthrene and ovalene. The fused positions of the 2 to 15 rings may be anywhere in the rings other than those shown above. Further, examples of the heterocyclic group include monocyclic heterocyclic groups such as a monovalent pyridine ring, pyrazine ring, pyrimidine ring, pyridazine ring, pyrrole ring, imidazole ring, pyrazole ring, furan ring, thiophene ring, oxazole ring, isoxazole ring, thiazole ring, isothiazole ring, furazan ring and selenophene ring and fused heterocyclic groups having a structure in which monocyclic heterocyclic rings and aromatic hydrocarbon rings are optionally combined and fused. Incidentally, the aryl group and heterocyclic group may have substituent(s), and may optionally be substituted at any substitutable position(s). In addition, such aryl groups, heterocyclic groups, or such an aryl group and such a heterocyclic group may be combined to form an oligomer. $R_{20}$ and $R_{21}$, and $R_{24}$ and $R_{25}$ may be bonded together to form ring A or a 5- or 6-membered heterocyclic ring, respectively. Here, examples of the 5- or 6-membered heterocyclic ring include pyridine ring, pyrazine ring, pyrimidine ring, pyridazine ring, pyrrole ring, imidazole ring, pyrazole ring, furan ring, thiophene ring, oxazole ring, isoxazole ring, thiazole ring, isothiazole ring, furazan ring and selenophene ring. The sum of "t", "u", and "v" is an integer of 1 or more. Of these examples, there are preferably used a structure which is converted by light to an acene compound, a structure which is converted by light to an oligomer in which 2 to 6 of the same kind or different kinds of the above-mentioned acene compounds are connected, and a structure which is converted by light to a structure in which a heterocyclic ring is connected to the above-mentioned acene compound. Incidentally, the term "acene compound" herein employed refers to a compound in which 3 or more rings selected from the aromatic hydrocarbon rings and heterocyclic rings such as, for example, anthracene, tetracene, pentacene, acridine and thianthrene are fused linearly.

Here, when energy is applied to an organic semiconductor precursor having a bicyclo skeleton represented by general formula (4) or (5) as a partial structure, the bicyclo skeleton receives the applied energy to cause a retro Diels-Alder reaction. Specifically, as illustrated in the following reaction formulae (1) and (2), the bicyclo skeleton is converted to an aromatic ring. Thereby, the organic semiconductor precursor changes to an organic semiconductor.

The Diels-Alder reaction is an organic chemical reaction in which a double bond called "dienophile" is added to a conjugated diene to thereby form a ring structure. A retro Diels-Alder reaction is a reverse reaction of the Diels-Alder reaction in which the formed ring structure is converted to a conjugated diene and a dienophile.

Reaction Formula (1)

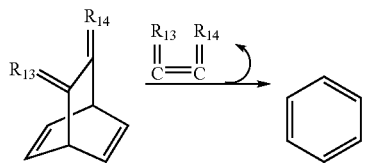

As illustrated in reaction formula (1), in the bicyclo skeleton represented by general formula (4) a unit of $R_{13}=C=C=R_{14}$ is eliminated by light, whereby the bicyclo skeleton changes to an aromatic ring. Incidentally, when the $R_{13}=C=C=R_{14}$ unit is an unstable structure, the $R_{13}=C=C=R_{14}$ unit may further be converted to a more stable structure. Therefore, $R_{13}$ and $R_{14}$ are selected from the viewpoint of whether the $R_{13}=C=C=R_{14}$ unit can be eliminated by light. $R_{13}$ and $R_{14}$ are each preferably any one of an oxygen atom, a sulfur atom and $NR_{15}$. Here, $R_{15}$ represents one selected from the group consisting of $C_1$-$C_{12}$ linear or branched alkyl group, alkenyl group, alkoxy group, alkylthio group, alkyl ester group, aryl group, and hydroxyl group. When the number of carbon atoms of $R_{15}$ is more than 12, the molecular weight of the eliminated component increases, and there are cases where such a component may remain in the formed organic semiconductor. In such a case, sufficient semiconductor characteristics cannot be obtained. A more preferable number of carbon atoms of $R_{15}$ is 6 or less. It is most preferable that $R_{13}$ and $R_{14}$ are both oxygen atoms.

Reaction Formula (2)

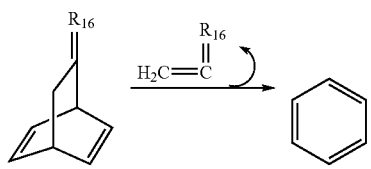

As illustrated in reaction formula (2), in the bicyclo skeleton represented by general formula (5) a unit of $CH_2{=}C{=}R_{16}$ is eliminated by light, whereby the bicyclo skeleton changes to an aromatic ring. Incidentally, when the $CH_2{=}C{=}R_{16}$ unit is an unstable structure, the $CH_2{=}C{=}R_{16}$ unit may further be converted to a more stable structure. Therefore, $R_{16}$ is selected from the viewpoint of whether the $CH_2{=}C{=}R_{16}$ unit can be eliminated by light. $R_{16}$ is preferably an oxygen atom or a sulfur atom.

Preferable examples of the organic semiconductor precursor used in the present invention will be shown below.

Although in the following examples α-diketone structures are shown as the bicyclo structure, the present invention is not limited thereto. Further, although unsubstituted structures are shown mainly, they may have substituent(s) if possible. The compounds shown below are intended to be illustrative only and the present invention is not intended to be limited to the compounds.

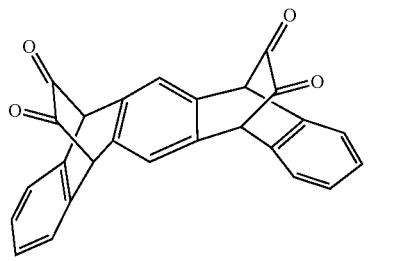
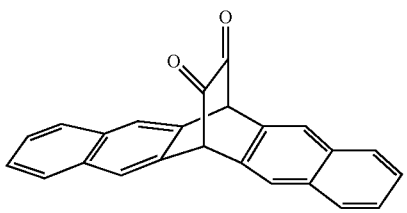
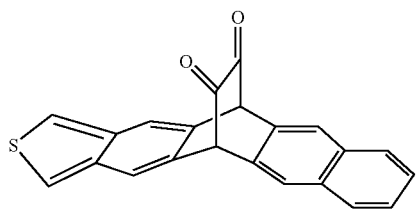
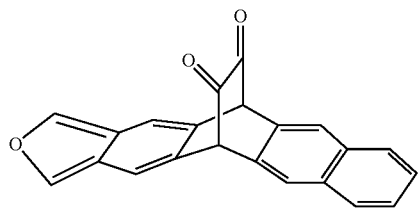
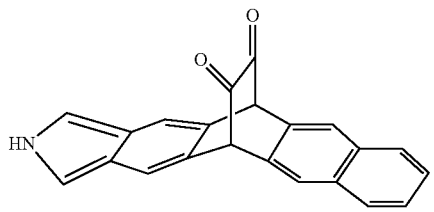
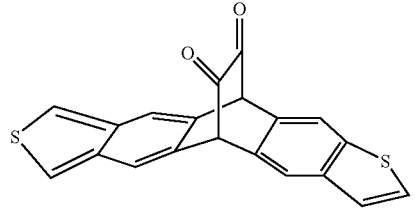
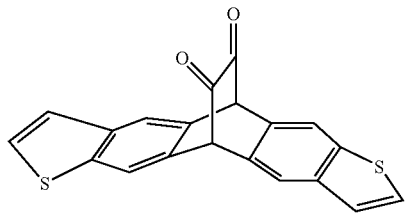
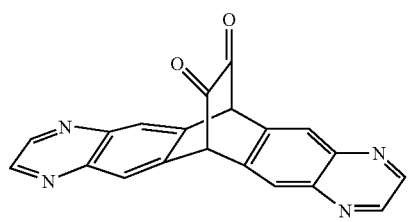
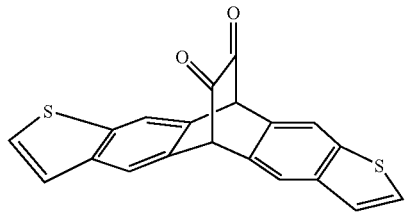
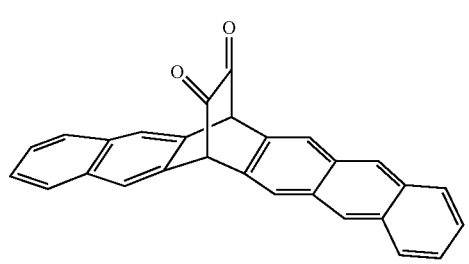

-continued

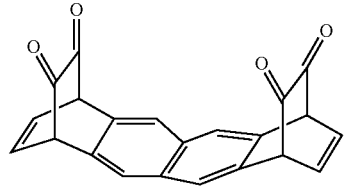
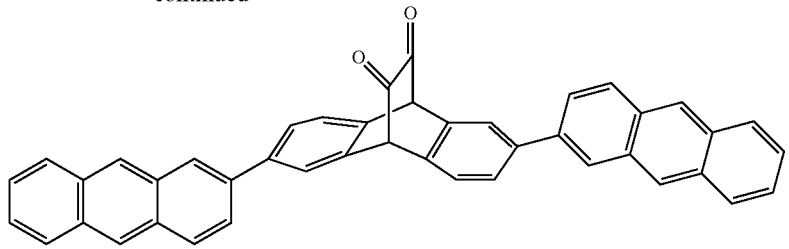

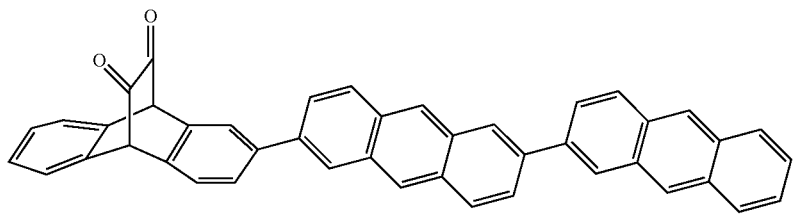

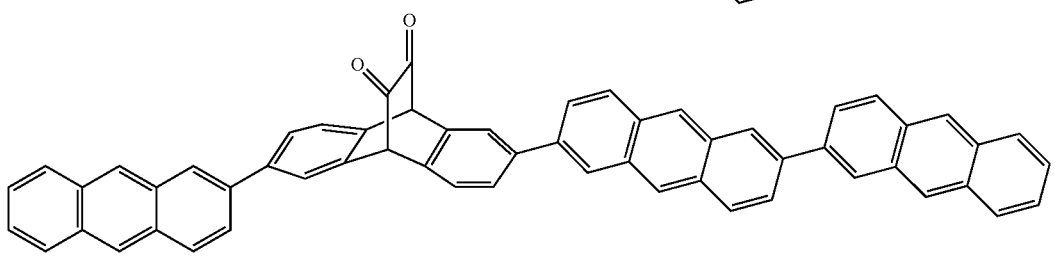

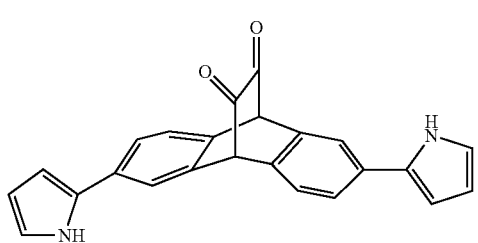
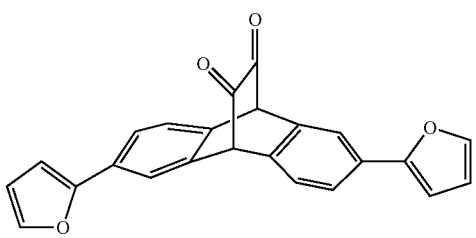

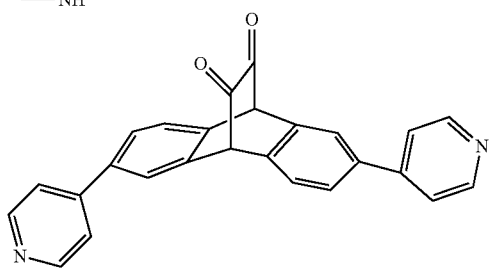
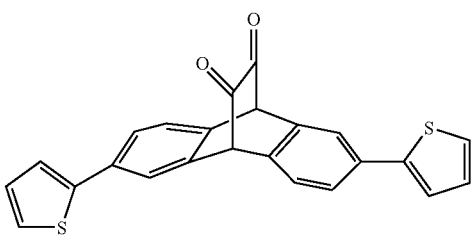

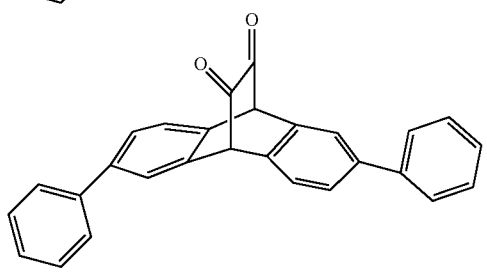

These organic semiconductor precursors are provided on a substrate having a crystallization promoting layer formed thereon, whereby an organic semiconductor precursor layer is formed. At this time it is preferable that the polysiloxane compound layer or crystallization promoting layer and the organic semiconductor precursor layer are brought into close contact with each other and stacked. The term "close contact" herein employed means a state in which at least a part of the polysiloxane compound layer or crystallization promoting layer and at least a part of the organic semiconductor precursor layer are in contact with each other without interposition of another layer.

The method of forming the organic semiconductor precursor layer is preferably such that the organic semiconductor precursor is dissolved in an organic solvent, followed by coating. The organic solvent used to dissolve the organic semiconductor precursor is not especially limited, as long as it does not react or precipitate. Further, two or more kinds of organic solvents may be used as a mixture. Here, it is preferable to select the solvent taking into account the smoothness of the coating film surface and the uniformity of the film thickness.

Examples of the solvent include acetone, methyl ethyl ketone, methyl isobutyl ketone, cyclohexanone, hexane, heptane, cyclohexane, tetrahydrofuran, dioxane, diethyl ether, isopropyl ether, dibutyl ether, toluene, xylene, 1,2-dimethoxyethane, chloroform, methylene chloride, dichloroethane, 1,2-dichloroethylene, dimethyl sulfoxide, N-methylpyrrolidone, chlorobenzene, dichlorobenzene, trichlorobenzene and the like. The concentration of the solution may be suitably adjusted depending on the desired film thickness but is preferably 0.01 to 5% by weight.

The coating method is not especially limited. Examples of the coating method include conventional coating methods, such as spin coating, casting, spray coating, a doctor blade method, die-coating, dipping, printing, an ink jet method and a dropping method. Examples of printing methods include screen printing, offset printing, gravure printing, flexographic printing, micro contact printing, and the like. Of these methods, spin coating, dipping, spray coating and an ink jet method are preferable, as these coating methods are able to control the coating amount, which enables a desired film thickness to be obtained. Further, it is desirable to filter the solution beforehand through a membrane filter in order to prevent the intrusion of dirt and the like into a coated film. This is because insoluble matter and dirt from outside may prevent uniform orientation, which causes an increase in the off current and a lowering in the on/off ratio. The coated film of the organic semiconductor precursor may also be preliminarily dried.

As described above, the organic semiconductor precursor layer is formed on the polysiloxane compound layer or crystallization promoting layer. Then, by applying light energy and thermal energy simultaneously, the bicyclo skeleton is converted to an aromatic ring (from the precursor to an organic semiconductor). Concurrently with the conversion to the aromatic ring, crystal growth occurs through stacking of organic semiconductors, whereby an organic semiconductor crystallized film is formed. In this manner a layer comprising an organic semiconductor is formed.

The light energy is applied by irradiating light to the organic semiconductor precursor layer. The wavelength of the light irradiated may be within the absorption wavelength range of the organic semiconductor precursor but is more preferably within the wavelength range of from 300 nm to 500 nm. This is because with light having a wavelength less than 300 nm, there is a fear of damage to a peripheral part or of side reactions, while with light having a wavelength more than 500 nm, there is a fear of damage to the obtained organic semiconductor. The light source may be selected from among a tungsten lamp, a halogen lamp, a metal halide lamp, a sodium lamp, a xenon lamp, a high-pressure mercury lamp, a low-pressure mercury lamp, various laser lights and the like. The light irradiation method is not especially limited, as long as the organic semiconductor precursor changes to an organic semiconductor. However, in consideration of effectively performing the light reaction, a method in which light is irradiated directly to the organic semiconductor precursor is preferable. However, in cases where the heat generated by light irradiation is applied to the organic semiconductor precursor, it is preferable to cut out the heat by means of a heat absorbing filter or the like.

By performing the light irradiation through a mask, patterning can also be conducted.

The thermal energy is applied by externally heating the substrate. Any method may be used as the heating method, although preferable methods include heating on a hot plate and heating in a hot air circulating oven or a vacuum oven. A more preferable method in the present invention is to heat the substrate on a hot plate. The preferred temperature will vary depending on the kind of the organic semiconductor precursor, although in consideration of the influence on peripheral parts, the heating temperature is preferably within the temperature range of from 50° C. to 180° C.

The time period in which light energy and thermal energy are applied simultaneously differs depending on the film thickness, material and the like and thus cannot be generally defined. Generally, it becomes difficult for light to reach a deep portion of the film as the organic semiconductor crystallized film grows. Therefore, it is preferable that the time period in which light energy and thermal energy are applied simultaneously is between 1 second and 30 minutes. By setting the time period within such a range, light can be effectively utilized for the conversion from the precursor to the organic semiconductor. More preferably, the time period in which light energy and thermal energy are applied simultaneously is 1 to 15 minutes.

According to detailed investigations carried out by the present inventors, the simultaneous application of light energy and thermal energy is important in realizing the excellent durability. For a sample in which only light energy was applied to an organic semiconductor precursor thin film to cause an elimination reaction, it was observed that when allowed to stand in the atmosphere, the specific color of the organic semiconductor obtained by the conversion was gradually faded and degraded. In contrast, for a sample wherein light energy and thermal energy were simultaneously applied to cause an elimination reaction, the specific color of the organic semiconductor did not fade even after being allowed to stand in the atmosphere air for 10 days or more. This is thought to be because the heating with the thermal energy serves to fill in gaps between crystal grains generated by the elimination reaction, thereby bringing the crystalline state of the organic semiconductor layer into a more stable crystalline state which is less susceptible to intrusion of oxygen and water. In the examples described later the effects of the present invention will be examined by taking a field effect transistor as an example. However, the effects of the present invention in improving durability as a result of stabilizing the crystalline state are not limited to the case of a field effect transistor and are considered as being applicable to semiconductor devices in general.

The film thickness of the organic semiconductor film obtained by the above described procedure is preferably 10 to 500 nm, more preferably 20 to 200 nm. The film thickness can be measured using a surface roughness meter or a step height scale.

According to further detailed investigations carried out by the present inventors, applying both light energy and thermal energy to the organic semiconductor precursor on the crystallization promoting layer to effect conversion into a layer comprising an organic semiconductor, can be considered important in maximizing the crystallization promoting function. Generally, when causing an elimination reaction by applying light energy and thermal energy to an organic semiconductor precursor to thereby form an organic semiconductor, it can be observed that gaps are generated between crystal grains made of the obtained compound. In contrast, when such a reaction is conducted on a crystallization promoting layer, it can be confirmed that gaps between crystal grains of the organic semiconductor layer are filled, whereby a uniform crystal is formed entirely on the substrate.

This is thought to be because the crystallization promoting layer promotes the stabilization (including cases where movement or rotation is involved) of the crystal grains of the organic semiconductor layer and bonding between the crystal grains.

The present inventors believe that such an action of the crystallization promoting layer improves the crystallinity of the organic semiconductor layer. It can also be considered that generation of bonding between the crystal grains is especially preferable.

The FIGURE is a schematic cross-sectional view of an organic field effect transistor according to the present invention. The field effect transistor according to the present invention is constituted by a gate electrode 1, an insulating layer 2, an A-layer 3 (polysiloxane compound layer or crystallization promoting layer), a source electrode 4, a drain electrode 5, and a B-layer 6 (organic semiconductor layer).

The materials for the gate electrode, source electrode and drain electrode are not particularly limited, provided that they are electrically conductive materials. Examples of such materials include platinum, gold, silver, nickel, chromium, copper, iron, tin, antimonial lead, tantalum, indium, aluminum, zinc, magnesium and alloys thereof; conductive metal oxides such as indium tin oxide; and inorganic and organic semiconductors having a conductivity improved by doping or the like, for example, silicon single-crystal, polysilicon, amorphous silicon, germanium, graphite, polyacetylene, polyparaphenylene, polythiophene, polypyrrole, polyaniline, polythienylenevinylene and polyparaphenylenevinylene. Methods of forming the electrodes include sputtering, vapor deposition, a printing method from a solution or a paste, an ink jet method or dipping. Further, preferable electrode materials of the above are those having a low electrical resistance at a contact surface with the semiconductor layer.

While any substance which is capable of uniformly coating the A-layer may be used as the insulating layer, preferably such substance has a high dielectric constant and a low conductivity. Examples thereof include inorganic oxides and nitrides such as silicon oxide, silicon nitride, aluminum oxide, titanium oxide and tantalum oxide; and polyacrylates, polymethacrylates, polyethylene terephthalate, polyimides, polyethers and the like. Of the above insulating materials, those having a high surface-smoothness are preferred. In addition, since the A-layer itself has excellent insulating properties, by adjusting the thickness of the A-layer to such a thickness as to develop insulating properties, the A-layer itself can also be used as the gate insulating layer.

The structure of the field effect transistor according to the present invention may be either one of a top contact electrode type, a bottom contact electrode type, and a top gate electrode type. Further, the structure is not limited to a horizontal structure, and may be a vertical structure.

EXAMPLES

The present invention will now be specifically explained with reference to the following examples.

Synthesis Example 1

First, a synthesis example of the bicyclo compound used in the present invention will be described by using 6,13-dihydro-6,13-ethanopentacene-15,16-dione as an example.

(Step 1)

In a reaction vessel, 5,6,7,8-tetramethylidenebicyclo[2,2,2]OCTA-2-ene (12 mmol, 1.91 g) and isoamyl nitrite (75 mmol, 10.0 ml) were dissolved in 80 ml of THF (tetrahydrofuran), and the resultant solution was heated to reflux. Anthranilic acid (91 mmol, 12.5 g) dissolved in 100 ml of THF was charged into a dropping funnel, and then slowly dropped into the refluxed solution. After the dropping, heating and stirring were continued until all the raw materials were consumed. After the completion of the reaction, an aqueous sodium hydroxide solution was added, stirring was continued, and the reaction solution was extracted with hexane. The resultant organic layer was washed with water and saturated saline, dried over anhydrous sodium sulfate and then concentrated to give a crude product. This was purified by silica gel column chromatography (hexane) to give the compound represented by the following general formula (9). The yield was 2.66 g (72%).

General Formula (9)

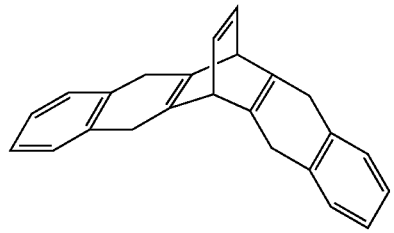

Molecular formula: $C_{24}H_{20}$ (308.42) Shape: White crystal 1H NMR (CDCl$_3$) δ=7.10 (4H, s), 6.85 (4H, ~J=3.41), 4.29 (2H, t, J=3.41), 3.60 (8H, s) [270 MHz] 13C NMR (CDCl$_3$) δ=140.179, 139.254, 134.241, 128.715, 125.858, 54.197, 33.164 [67.8 MHz] Mass spectrum (FAB) m/z: 308 (M+:22) Elemental analysis: Calcd (%) C=93.46; H=6.54 Found (%) C=93.54; H=6.68

(Step 2)

The compound (4.02 mmol, 1.24 g) obtained in Step 1 was charged into a reaction vessel and dissolved in 50 ml of chloroform. This solution was added with DDQ (2,3-dichloro-5,6-dicyano-1,4-benzoquinone) (8.04 mmol, 1.80 g) and stirred for 2 hours. The resultant solution was then added and well mixed with a saturated aqueous sodium bicarbonate solution. The resultant organic layer was washed with water and saturated saline, dried over anhydrous sodium sulfate and then concentrated under reduced pressure to give a crude product. This was purified by silica gel column chromatography (10% ethyl acetate/hexane) to give the compound represented by the following general formula (10).

General Formula (10)

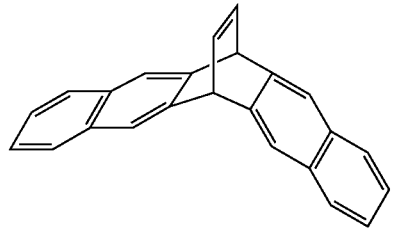

Yield 1.20 g (98%) Molecular formula: $C_{24}H_{16}$ (304.38) Melting point: 277.2° C. Shape: White crystal 1H NMR ($CDCl_3$) δ=7.72 (4H, s), 7.69 (4H, m), 7.37 (4H, m), 7.04 (2H, q, J=3.42, 0.98), 5.32 (2H, m) [270 MHz] 13C NMR ($CDCl_3$) δ=142.13, 138.24, 131.68, 127.42, 125.52, 121.23, 50.15 [67.8 MHz] Infrared absorption spectrum (KBr) $cm^{-1}$: 3054, 2973 Mass spectrum (DIEI) m/z: 304 (M+:100), 278 (13) Elemental analysis: Calcd (%) C=94.70; H=5.30 Found (%) C=94.36; H=5.58

(Step 3)

NM0 (N-methylmorpholine-N-oxide)-$H_2O$ (5.60 mmol, 0.78 g) and a rotor were placed in a 1L round-bottomed flask, which was purged with argon. Further, 500 ml of acetone was added into the flask, and $OsO_4$ (0.10 mmol, 5 ml) was then added therein. The compound (4.11 mmol, 1.25 g) obtained in Step 2 was added to the resultant mixture, and the flask was stoppered. The mixture was vigorously stirred for 32 hours while maintaining at room temperature. The resultant mixture was added with an aqueous solution of $Na_2S_2O_4$ (0.6 g) and the solution was stirred for 10 minutes, and then filtered through Celite. The mother liquor was extracted with ethyl acetate. The resultant organic layer was washed with water and saturated saline, dried over anhydrous sodium sulfate and then concentrated under reduced pressure to give 6,13-dihydro-15,16-dihydroxy-6,13-ethanopentacene as a white crystal.

Yield 1.36 g (98%) Molecular formula: $C_{24}H_{18}O_2$ (338.40) Melting point: 299.8° C. Shape: White crystal 1H NMR ($CDCl_3$) δ=7.85 (2H, s), 7.80 (8H, m), 7.43 (4H, m), 4.66 (2H, s), 4.22 (2H, s) [270 MHz] 13C NMR ($CDCl_3$) δ=137.349, 135, 876, 132, 722, 127.574, 125.876, 125.813, 125.220, 123.324, 68.411, 51.187 [100.4 MHz] Infrared absorption spectrum (KBr) $cm^-$:3432.67, 370.68 (OH) Mass spectrum (FAB) m/z: 339 (M+:4) Elemental analysis: Calcd (%) C=62.15; H=4.69 Found (%) C=62.01; H=4.75

(Step 4)

Dry DMSO (dimethyl sulfoxide) (132 mmol, 9.4 ml) and 69 ml of dry $CH_2Cl_2$ were charged into a three-necked reaction vessel in an inert gas atmosphere, and cooled to −60° C. with an acetone/liquid nitrogen bath. To the mixture, 119 mmol (16.5 ml) of anhydrous trifluoroacetic acid was slowly added dropwise with the liquid temperature being kept at −60° C. and the resultant solution was stirred for 10 minutes. Then, to the resultant mixture, 6,13-dihydro-15,16-dihydroxy-6,13-ethanopentacene (3.81 mmol, 1.29 g) dissolved in a minimum amount of dry DMSO was slowly added dropwise, and the resultant solution was stirred for 15 hours. Triethylamine (275 mmol, 20.7 ml) was added dropwise into the solution while maintaining the liquid temperature at −60° C., which was then stirred for 1.5 hours. The reaction solution was slowly poured into 2M HCl (200 ml) and was extracted with $CH_2Cl_2$. The resultant organic layer was washed with ion-exchanged water and saturated saline, dried over anhydrous sodium sulfate and then concentrated under reduced pressure to give a crude product, which was then added with ethyl acetate. Insoluble matter was collected by filtration to give 6,13-dihydro-6,13-ethanopentacene-15,16-dione.

Yield 0.55 g (43%) Molecular formula: $C_{24}H_{14}O_2$ (334.37) Melting point: 318 to 323° C. Shape: Yellow crystal 1H NMR (CDCl3) δ=7.94 (4H, s), 7.84 (4H, m), 7.52 (4H, m), 5.31 (2H, s) [270 MHz] 13C NMR ($CDCl_3$) δ=185.165, 133.585, 131.851, 127.862, 127.017, 125.364, 60.603 [67.8 MHz] Infrared absorption spectrum (KBr) cm-1:1754.90, 1735.62 (C=O) Mass spectrum (DIEI) m/z: 335 (M+:4) Elemental analysis: Calcd (%) C=86.21; H=4.22 Found (%) C=86.41; H=4.40

Synthesis Example 2

In addition to the synthesis method of 6,13-Dihydro-6,13-ethanopentacene-15,16-dione exemplified in Synthesis Example 1, another synthesis method will be further described below.

(Step 1)

Pentacene (1.39 g, 5.0 mmol), vinylene carbonate (0.32 g, 5.0 mmol) and xylene (95 ml) were charged into an autoclave, and stirred for 72 hours at 180° C. After the reaction, the resultant product was concentrated under reduced pressure, and then dried, thereby giving a compound represented by the general formula (11) (1.78 g, 98%).

General Formula (11)

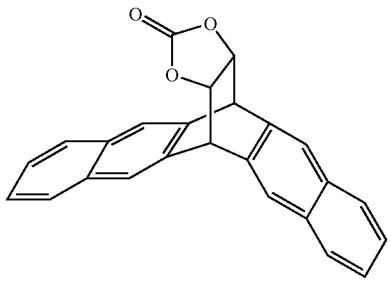

Step (2)

The compound (1 g, 2.7 mmol) obtained in Step 1 was charged into a reaction vessel and dissolved in 30 ml of 1,4-dioxane. This solution was added with (4 M) NaOH (11.3 ml) and refluxed for 1 hour. After completion of the reaction, the resultant product was poured into water, and was extracted with ethyl acetate. The resultant organic layer was washed with water and saturated saline, dried over anhydrous sodium sulfate and then concentrated under reduced pressure, whereby the intended 6,13-dihydro-15,16-dihydroxy-6,13-ethanopentacene (0.91 g, 100%) was obtained.

Step (3)

A reaction vessel was purged with nitrogen, and then charged with dimethylsulfoxide (8.6 ml, 93.5 mmol) and methylene chloride (48 ml). Once the reaction vessel was cooled to −60° C., the mixture was added with anhydrous trifluoroacetic acid (11.7 ml, 84.3 mmol), and the resultant solution was stirred for 10 minutes. After stirring, a solution of the 6,13-dihydro-15,16-dihydroxy-6,13-ethanopentacene (0.96 g, 2.7 mmol) obtained in Step 2 dissolved in dimethyl sulfoxide (4 ml) was slowly added dropwise into the reaction solution. After the dropwise addition, stirring was performed for 1.5 hours while maintaining the temperature at −60° C., and then the resultant solution was added with triethylamine (27.5 ml). Then, stirring was further performed for 1.5 hours, after which the temperature was returned to room temperature. The reaction solution was poured into 10% hydrochloric acid (150 ml) and was extracted with methylene chloride. The resultant organic layer was washed with water and saturated saline, dried over anhydrous sodium sulfate and then concentrated under reduced pressure. The obtained crude product was washed with ethyl acetate to give the intended 6,13-dihydro-6,13-ethanopentacene-15,16-dione (0.45 g, 50%)

Synthesis Example 3

Next, description will be made by taking dibromo-6,13-dihydro-6,13-ethanopentacene-15,16-dione as an example.

(Step 1)

2,6-Dibromoanthracene (2.41 mmol, 0.67 g), vinylene carbonate (3.80 mmol, 0.21 ml) and anhydrous xylene (10 ml) were charged into an autoclave, and the resultant mixture was allowed to react for 3 days at 180° C. After the reaction, the temperature was returned to room temperature, and the resultant product was concentrated under reduced pressure. The obtained crude product was purified by silica gel column chromatography, to thereby give 2,6-dibromo-9,10-dihydro-9,10-ethanoanthracene-cis-11,12-diyl carbonate (0.73 g, 72%).

(Step 2)

The 2,6-dibromo-9,10-dihydro-9,10-ethanoanthracene-cis-11,12-diyl carbonate (0.58 mmol, 0.24 g) obtained in Step 1, a boronic ester (1.33 mmol, 0.40 g) obtained according to the method disclosed in a document (K. Ito, T. Suzuki, Y. Sakamoto, D. Kubota, Y. Inoue, F. Sato, S. Tokito, Angew. Chem. Int. Ed. 2003, 42, 1159-1162. ), tetrakis(triphenylphosphine) palladium (0) (0.066 mmol, 0.077 g), toluene (202 ml), and 1N $Na_2CO_3$ (8.5 ml) were charged into a flask. The flask was purged with nitrogen, and the mixture was refluxed for 18 hours. Then, the temperature was returned to room temperature, and the mixture was filtered through Celite, and the resultant filtered product was washed with toluene. Then, the filtrate was concentrated under reduced pressure, and the obtained crude product was purified by silica gel chromatography, to thereby give the intended 2,6-(2'-anthryl)-9,10-dihydro-9,10-ethanoanthracene-cis-11,12-diyl carbonate (0.089 g, 25%).

(Step 3)

The 2,6-(2'-anthryl)-9,10-dihydro-9,10-ethanoanthracene-cis-11,12-diyl carbonate (0.11 mmol, 0.067 g) obtained in Step 2 was added into a mixed solution of 4N NaOH (2 ml) and 1,4-dioxane (4 ml), and the vessel was purged with nitrogen. Then, after the mixture was refluxed for 1 hour, the temperature was returned to room temperature. Next, water was added into the mixture, which was then extracted with chloroform. The resultant organic layer was washed with water and saturated saline, dried over anhydrous sodium sulfate and then concentrated under reduced pressure, to thereby give a diol product. The obtained diol product was subjected to Swern oxidation by the same method as that described in Step 4 of Synthesis Example 1, to thereby give the intended 2,6-dianthryl-9,10-dihydro-9,10-ethanoanthracene-11,12-dione (0.046 g, 69%).

Preparation of Resin Solution "a"

1.0 g of commercially available flake-shaped methylsilsesquioxane (MSQ) (manufactured by Showa Denko K.K.; Product name: GR650) was dissolved in a mixed solvent consisting of 49.5 g of ethanol and 49.5 g of 1-butanol, to thereby prepare resin solution "a".

Preparation of Resin Solution "b"

1.0 g of methyltrimethoxysilane was completely dissolved in a mixed solvent consisting of 49.5 g of ethanol and 49.5 g of 1-butanol. The resultant solution was added with 0.83 g of distilled water and 0.05 g of formic acid. This resultant solution was stirred for 48 hours at room temperature, to thereby prepare silica sol (resin solution) "b".

Example 1

The FIGURE shows the structure of a top electrode-type field effect transistor according to Example 1.

First, a highly doped N-type silicon base member was provided as a gate electrode 1. A silicon oxide film with a thickness of 5,000 Å obtained by thermally oxidizing the surface layer of the silicon substrate was used as a gate insulating layer 2. Next, the resin solution "a" was coated onto the surface of the insulating layer by spin coating (rotation frequency: 5,000 rpm). The coated film was then transferred onto a hot plate, and heated at 100° C. for 5 minutes and at 220° C. for 30 minutes, to thereby form an A-layer 3 (polysiloxane layer).

Next, on the A-layer 3 thus formed on the substrate, a 1.0 wt.% solution of the 6,13-dihydro-6,13-ethanopentacene-15,16-dione obtained in Syntheses Example 1 in chloroform was coated by spin coating. The rotation frequency was 1,000 rpm. Thus, a coated film was formed. Further, the substrate having the coated film thus formed thereon was placed on a hot plate set to 120° C. and irradiated with light from a metal halide lamp (manufactured by NIPPON P. I. CO., LTD.; PCS-UMX250 (trade name)) through a heat absorbing filter and a blue filter for 5 minutes, thereby forming a B-layer 6 (organic semiconductor layer). Au was vapor-deposited onto the B-layer 6 using a mask to form a source electrode 4 and a drain electrode 5. The conditions during electrode formation were such that the degree of vacuum inside the vapor-deposition apparatus chamber was $1.33 \times 10^{-4}$ Pa ($1 \times 10^{-6}$ Torr) and the substrate temperature was room temperature. The film thickness of the obtained electrodes was 100 nm.

Four (4) elements of field effect transistors with a channel length L being 50 μm and a channel width W being 3 mm were produced by following the above procedure. The $V_d$-$I_d$ and $V_g$-$I_d$ curves of the thus produced transistors were measured using a Parameter Analyzer 4156C (trade name) manufactured by Agilent Technologies Inc. Incidentally, the measurement was performed for each of the four devices.

Mobility μ ($cm^2$/Vs) was calculated according to the following equation (1).

$$I_d = \mu(CiW/2L)(V_g - V_{th})^2 \qquad \text{(equation 1)}$$

In the equation, Ci represents the capacitance (F/$cm^2$) per unit area of the gate insulating film; W and L, respectively, represent a channel width (mm) and a channel length (μm) shown in the example; and $I_d$, $V_g$, and $V_{th}$, respectively, represent a drain current (A), a gate voltage (V), and a threshold voltage (V). Further, the ratio of $I_d$ for $V_g$=−80 V and $I_d$ for $V_g$=0 V at $V_d$=−80 V was defined as an on/off ratio. The electric field effect mobility as calculated from the obtained results had a maximum value of the 4 devices of 0.18 $cm^2$/Vs, a minimum value of 0.18 $cm^2$/Vs, and an average value of 0.18 $cm^2$/Vs. In addition, the on/off ratio had a maximum value of $1.5 \times 10^5$, a minimum value of $1.2 \times 10^5$, and an average value of $1.3 \times 10^5$.

Example 2

Four (4) devices were produced by following the same procedure as in Example 1 with the exception that resin solution "a" was changed to resin solution "b". The evaluation of electrical characteristics was conducted in the same manner as in Example 1. The electric field effect mobility as calculated from the obtained results had a maximum value of the 4 devices of 0.34 $cm^2$/Vs, a minimum value of 0.26 $cm^2$/Vs, and an average vale of 0.29 $cm^2$/Vs. In addition, the on/off ratio had a maximum value of $2.0 \times 10^6$, a minimum value of $1.6 \times 10^6$, and an average value of $1.8 \times 10^6$.

Example 3

The same highly doped N-type silicon base member provided with a silicon oxide film as that in Example 1 was coated by spin coating with a 1.0 wt. % solution of the 6,13-dihydro-6,13-ethanopentacene-15,16-dione obtained in Syntheses Example 1 in chloroform. The rotation frequency was 1,000 rpm. Thus, a coated film was formed. Further, the substrate having the coated film thus formed thereon was placed on a hot plate set to 120° C. and irradiated with light from a metal halide lamp (manufactured by NIPPON P. I. CO., LTD.; PCS-UMX250 (trade name)) through a heat absorbing filter and a blue filter for 5 minutes, thereby forming a B-layer 6 (organic semiconductor layer). After the light irradiation, it was confirmed that a yellow layer, which was the precursor layer, was changed to a blue layer, which was a pentacene layer. Gold was vapor-deposited thereon using a mask to form a source electrode 4 and a drain electrode 5.

Four (4) elements of field effect transistors with a channel length L of 50 μm and a channel width W of 3 mm were fabricated on the same substrates by following the above procedure, and their electrical characteristics were evaluated in the same manner as in Example 1. The electric field effect mobility as calculated from the obtained results had a maximum value of the 4 devices of 0.098 cm$^2$/Vs, a minimum value of 0.088 cm$^2$/Vs, and an average value of 0.088 cm$^2$/Vs. In addition, the on/off ratio had a maximum value of $1.3 \times 10^4$, a minimum value of $4.7 \times 10^3$, and an average value of $8.4 \times 10^3$.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of producing a semiconductor device comprising an organic semiconductor layer, which comprises the steps of:
    providing a crystallization promoting layer on a substrate;
    providing an organic semiconductor precursor on the crystallization promoting layer; and
    applying light energy and thermal energy simultaneously to the organic semiconductor precursor to form a layer comprising an organic semiconductor,
    wherein the organic semiconductor precursor comprises at least one partial structure represented by the following general formula (4) or (5):

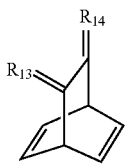

General Formula (4)

wherein $R_{13}$ and $R_{14}$ each independently represent one selected from the group consisting of an oxygen atom, a sulfur atom and $NR_{15}$; and $R_{15}$ represents one selected from the group consisting of $C_1$-$C_{12}$ linear or branched alkyl group, alkenyl group, alkoxy group, alkylthio group, alkyl ester group, aryl group, and hydroxyl group; and

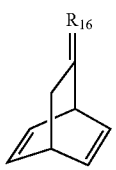

General Formula (5)

wherein $R_{16}$ represents an oxygen atom or sulfur atom.

2. The method according to claim 1, wherein as the organic semiconductor precursor, there is used a compound represented by the following general formula (6):

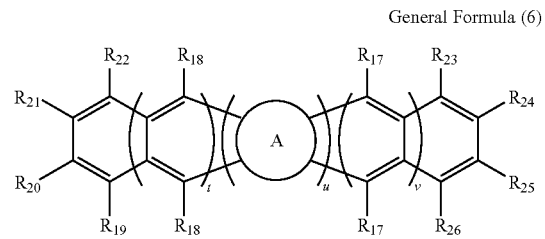

General Formula (6)

wherein ring "A" represents one selected from the group consisting of the bicyclo rings represented by general formulae (4) and (5); $R_{17}$ and $R_{18}$ each independently represent a hydrogen atom, an alkyl group, an alkoxyl group, an ester group or a phenyl group; $R_{19}$, $R_{20}$, $R_{21}$, $R_{22}$, $R_{23}$, $R_{24}$, $R_{25}$, and $R_{26}$ each independently represent a hydrogen atom, an alkyl group, an alkoxyl group, an aryl group, a heterocyclic group, an aralkyl group, a phenoxy group, a cyano group, a nitro group, an ester group, a carboxyl group or a halogen atom; $R_{20}$ and $R_{21}$, and $R_{24}$ and $R_{25}$ may be bonded together to form ring A or a 5- or 6-membered heterocyclic ring, respectively; and the sum of "t", "u", and "v" is an integer of 1 or more.

3. The method according to claim 2, wherein ring A in the general formula (6) is represented by the general formula (4), and $R_{13}$ and $R_{14}$ each represent an oxygen atom.

4. The method according to claim 1, wherein the thermal energy applied simultaneously with the light energy is heat of 50° C. to 180° C.

5. The method according to claim 1, wherein the crystallization promoting layer comprises at least one polysiloxane compound represented by the following general formula (2) or (3):

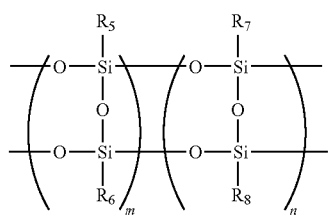

General Formula (2)

wherein $R_5$, $R_6$, $R_7$, and $R_8$ are selected independently from the group consisting of a substituted or unsubstituted alkyl group having 1 to 8 carbon atoms, an alkenyl group, and a substituted or unsubstituted phenyl group; "m" and "n" are each an integer of 0 or more; and the sum of "m" and "n" is an integer of 1 or more; and

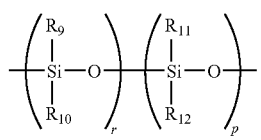

General Formula (3)

wherein $R_9$, $R_{10}$, $R_{11}$, and $R_{12}$ are selected independently from the group consisting of a substituted or unsubstituted alkyl group having 1 to 8 carbon atoms, an alkenyl group, and a substituted or unsubstituted phenyl group; "r" and "p" are each an integer of 0 or more; and the sum of "r" and "p" is an integer of 1 or more.

* * * * *